US010348528B2

(12) United States Patent
Mittal et al.

(10) Patent No.: US 10,348,528 B2
(45) Date of Patent: Jul. 9, 2019

(54) SYSTEMS AND METHODS TO PROVIDE UPCONVERTING WITH NOTCH FILTERING

(71) Applicant: QUALCOMM Incorporated, San Diego, CA (US)

(72) Inventors: Ayush Mittal, Bangalore (IN); Bhushan Shanti Asuri, San Diego, CA (US); Krishnaswamy Thiagarajan, Bangalore (IN); Sameer Vasantlal Vora, San Diego, CA (US); Mahim Ranjan, San Diego, CA (US)

(73) Assignee: QUALCOMM Incorporation, San Diego, CA (US)

( * ) Notice: Subject to any disclaimer, the term of this patent is extended or adjusted under 35 U.S.C. 154(b) by 41 days.

(21) Appl. No.: 15/472,454

(22) Filed: Mar. 29, 2017

(65) Prior Publication Data

US 2018/0139078 A1    May 17, 2018

Related U.S. Application Data

(60) Provisional application No. 62/459,405, filed on Feb. 15, 2017, provisional application No. 62/420,602, filed on Nov. 11, 2016.

(51) Int. Cl.
*H04L 25/03*    (2006.01)
*H04L 27/36*    (2006.01)
(Continued)

(52) U.S. Cl.
CPC ........... *H04L 25/03* (2013.01); *H03D 7/1458* (2013.01); *H03D 7/165* (2013.01); *H04B 1/0475* (2013.01);
(Continued)

(58) Field of Classification Search
CPC ......... H04L 25/00; H04L 25/02; H04L 25/03; H04L 27/36; H04B 1/0475; H03D 7/1458;
(Continued)

(56) References Cited

U.S. PATENT DOCUMENTS 7,167,686 B2    1/2007  See et al.
8,058,949 B2 *  11/2011  Ko ........................... H03H 7/06
                                                327/552
(Continued)

FOREIGN PATENT DOCUMENTS

CN    103187982 A    7/2013
GB      2500057 A    9/2013

OTHER PUBLICATIONS

Ingels M., et al., "A Multiband 40nm CMOS LTE SAW-Less Modulator with -60dBc C-IM3," Solid-State Circuits Conference Digest of Technical Papers (ISSCC), 2013 IEEE International, session 19, 19.6, pp. 338-340, Retrieved from the Internet: URL: http://ieeexplore.ieee.org/stamp/stamp.jsp?tp=&arnumber=6487760 &tag=1.
(Continued)

*Primary Examiner* — Betsy Deppe
(74) *Attorney, Agent, or Firm* — Haynes and Boone, LLP

(57) ABSTRACT

A system includes: a baseband phase generator configured to receive differential in-phase (I) and quadrature (Q) signals and configured to output N phase-shifted baseband signals, wherein N is greater than 4, further wherein the baseband phase generator comprises a plurality of notch filters configured to receive the I and Q signals; and an upconverter configured to receive the phase-shifted baseband signals, to perform mixing on the phase-shifted baseband signals, and to output a differential upconverted signal.

6 Claims, 9 Drawing Sheets

(51) Int. Cl.
*H03D 7/14* (2006.01)
*H04B 1/04* (2006.01)
*H03D 7/16* (2006.01)
*H03H 7/21* (2006.01)
*H03H 7/01* (2006.01)

(52) U.S. Cl.
CPC ..... *H04L 27/36* (2013.01); *H03D 2200/0082* (2013.01); *H03D 2200/0086* (2013.01); *H03H 7/21* (2013.01); *H03H 2007/013* (2013.01); *H04L 25/03828* (2013.01)

(58) Field of Classification Search
CPC ........... H03D 7/165; H04H 7/12; H03H 7/12; H03H 7/21
See application file for complete search history.

(56) References Cited

U.S. PATENT DOCUMENTS

| | | | |
|---|---|---|---|
| 8,963,610 B2 | 2/2015 | Mishra et al. | |
| 9,130,532 B2 | 9/2015 | Hasan et al. | |
| 9,369,261 B2 | 6/2016 | Furuta et al. | |
| 9,407,379 B2 | 8/2016 | Lau et al. | |
| 2003/0087614 A1* | 5/2003 | Kramer | H03C 3/40 455/112 |
| 2009/0154597 A1* | 6/2009 | Pan | H04B 1/0475 375/303 |
| 2012/0063496 A1* | 3/2012 | Giannini | H04B 1/0475 375/221 |
| 2014/0241727 A1* | 8/2014 | Lim | H04J 14/0298 398/76 |
| 2015/0094004 A1 | 4/2015 | Vora et al. | |
| 2015/0288392 A1 | 10/2015 | Floyd et al. | |
| 2015/0349821 A1 | 12/2015 | Rai et al. | |
| 2017/0026031 A1* | 1/2017 | Levesque | H03H 7/0153 |

OTHER PUBLICATIONS

Shrestha R., et al., "A Polyphase Multipath Technique for Software-Defined Radio Transmitters," IEEE Journal of Solid State Circuits, Dec. 2006, vol. 41, No. 12, pp. 2681-2692, Retrieved from the Internet: URL: http://ieeexplore.ieee.org/stamp/stamp.jsp?arnumber=4014635.

Subhan S., et al., "A 100-800 MHz 8-Path Polyphase Transmitter With Mixer Duty-Cycle Control Achieving 40 dBc for ALL Harmonics," IEEE Journal of Solid State Circuits, Mar. 2014, vol. 49, No. 3, pp. 595-607, Retrieved from the Internet: URL: http://ieeexplore.ieee.org/stamp/stamp.jsp?tp=&arnumber=6716097.

International Search Report and Written Opinion—PCT/US2017/056382—ISA/EPO—dated Jan. 22, 2018.

* cited by examiner

SYSTEMS AND METHODS TO PROVIDE UPCONVERTING WITH NOTCH FILTERING

CROSS-REFERENCE TO RELATED APPLICATIONS

The present application claims the benefit of U.S. Provisional Patent Application No. 62/459,405, filed Feb. 15, 2017, and entitled "SYSTEMS AND METHODS TO PROVIDE UPCONVERTING WITH NOTCH FILTERING", and claims the benefit of U.S. Provisional Patent Application No. 62/420,602, filed Nov. 11, 2016, and entitled "SYSTEMS AND METHODS TO PROVIDE BASEBAND PHASES," the disclosures of which are incorporated by reference herein in their entirety.

TECHNICAL FIELD

This application relates to electronic upconverters, and more particularly, to electronic upconverters with notch filtering.

BACKGROUND

In an example conventional Long Term Evolution (LTE) radio frequency (RF) transmitter, an oversampling digital-to-analog converter (DAC) block may be employed to convert a modem's digital baseband signals to analog. The DAC's output contains thermal and quantization noise to be filtered using a low-pass baseband filter. Also the DAC output contains alias of the baseband signal at the DAC's sampling frequency. This DAC alias may fall into an RX band in some carrier aggregation modes resulting in desensitization of the receiver path. Hence it would be beneficial to use a sharp attenuation in a baseband filter (BBF) to suppress DAC alias.

A notch filter may be employed to achieve this rejection at DAC sampling frequency. For instance, a passive resistive capacitive (RC) Twin-T notch is an available architecture which may be placed in series with a baseband filter to remove the DAC alias.

The output from the baseband filters may include in-phase (I) and quadrature (Q) phases of the analog signal. Some conventional systems use a harmonic reject mixer to receive the I-Q phases and to upconvert the signal. When a harmonic reject mixer is being used, it may employ multiple phases from the baseband filter apart from the usual I-Q phases. These extra phases may be generated by linearly combining I-Q phases through use of a passive resistive capacitive (RC) circuit. In an example using a harmonic reject mixer and a notch filter, the notch filter may be placed before the harmonic reject mixer and integrated with the baseband filter.

It would be desirable to save semiconductor die space by reducing the total number of components in the harmonic reject mixer and notch filter.

SUMMARY

Various embodiments described herein provide circuits and methods to generate a plurality of phase-shifted baseband signals using an arrangement of notch filters. According to one embodiment, a system includes: a baseband phase generator configured to receive differential in-phase (I) and quadrature (Q) signals and configured to output N phase-shifted baseband signals, wherein N is greater than 4, further wherein the baseband phase generator comprises a plurality of notch filters configured to receive the I and Q signals; and an upconverter configured to receive the phase-shifted baseband signals, to perform mixing on the phase-shifted baseband signals, and to output a differential upconverted signal.

According to another embodiment, a method includes: receiving differential in-phase (I) and quadrature (Q) baseband signals at inputs to a baseband phase generator; at the baseband phase generator, applying the differential I and Q baseband signals to a plurality of notch filters to generate N phase-shifted baseband signals, wherein N is greater than 4; and upconverting the phase-shifted baseband signals to produce a plurality of radio frequency (RF) signals.

According to another embodiment, a radio frequency (RF) transmit path including: means for generating differential in-phase (I) and quadrature (Q) baseband signals; means for generating N phase-shifted baseband signals from the I and Q baseband signals through use of a plurality of notch filters, wherein N is greater than 4; and means for upconverting the phase shifted baseband signals to produce a plurality of RF signals.

According to yet another embodiment, a wireless device comprising: a baseband phase generator configured to receive differential in-phase (I) and quadrature (Q) signals at inputs of a plurality of twin-T notch filters, wherein the baseband phase generator is further configured to output N phase-shifted baseband signals, wherein N is greater than four; and a harmonic reject upconversion mixer configured to receive the phase-shifted baseband signals and to generate a differential output RF signal from the phase-shifted baseband signals.

DESCRIPTION

Figure 1:
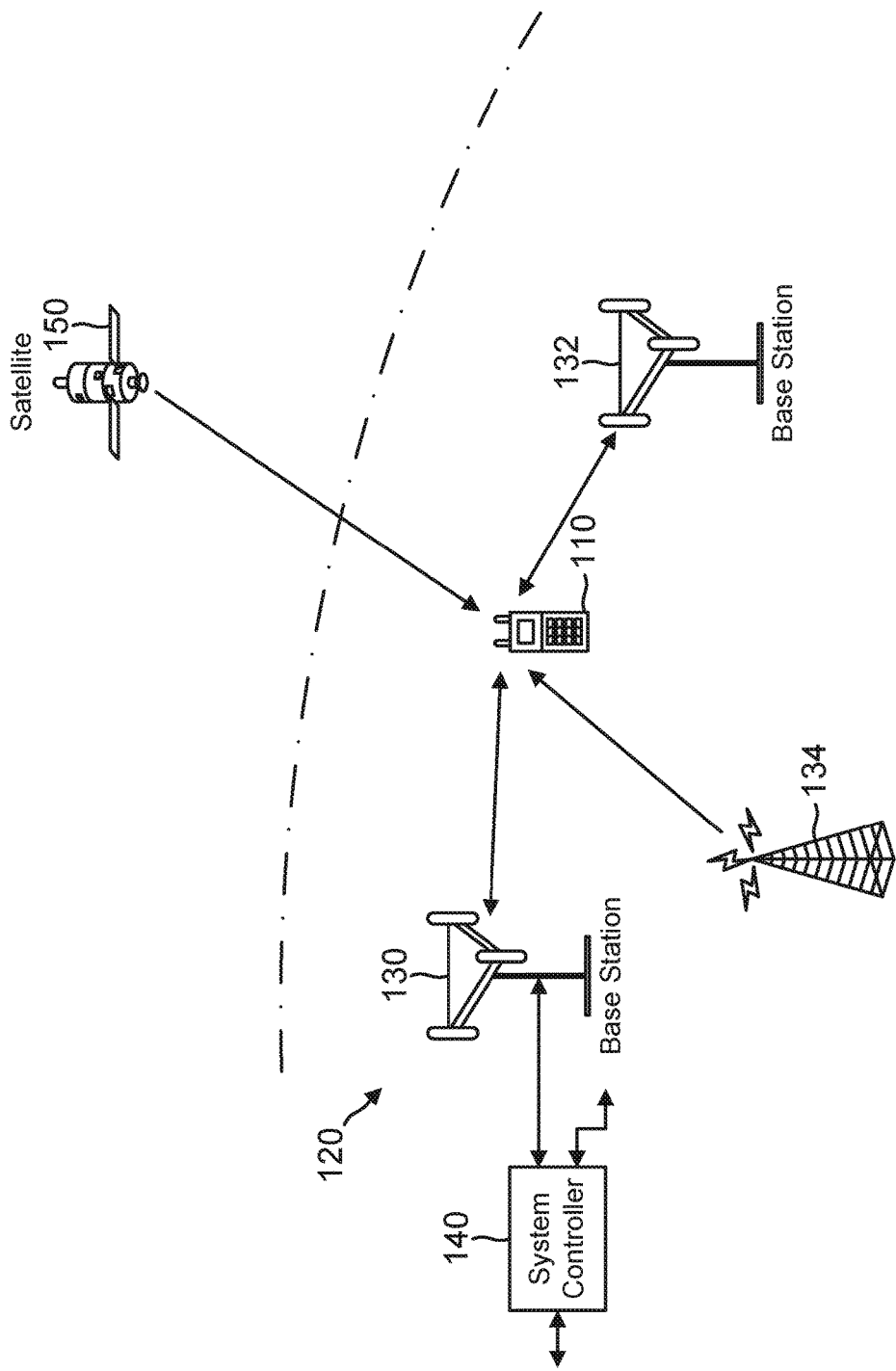
FIG. 1 illustrates an example wireless device communicating with a wireless system, in accordance with an embodiment.

Circuits and methods for generating phase-shifted baseband signals are provided herein. For instance, one embodiment includes a baseband phase generator receiving differential in-phase (I) and quadrature (Q) input signals in generating phase-shifted baseband signals. The phase generator, itself, may include a network of RC notch filters that receives the I and Q input signals and generates the phase-shifted baseband signals therefrom. In this manner, some embodiments may integrate notch filters into the phase generator and omit upstream notch filters that might otherwise be implemented with a transmit baseband filter. Or put another way, the notch filters themselves may be used to generate the phase-shifted baseband signals, and in some embodiments this may take the place of separate phase generators and notch filters. Some embodiments may include a benefit of reducing a total number of components of the system, thereby saving silicon area and lowering costs.

In one example, a baseband phase generator may receive the differential I and Q input signals and generate eight phase-shifted baseband signals. The baseband phase generator may include six twin-T notch filters arranged so as to receive the differential I and Q input signals as inputs. Output nodes at the twin-T notch filters provide the phase-shifted baseband signals having incremental 45° phase shifts.

In another example, a baseband phase generator may generate six phase-shifted baseband signals. Such example baseband phase generator may include four twin-T notch filters receiving the differential I and Q input signals as inputs. Once again, output nodes of the twin-T notch filters provide the phase shifted baseband signals, this time having incremental 60° phase shifts.

Continuing with these examples, each twin-T notch filter may be implemented using passive components. In one example, a given twin-T notch filter may be implemented using a resistive and capacitive (RC) network, where the values of the resistors and capacitors may be chosen to provide a particular frequency notch, as described in more detail below.

Furthermore, some embodiments include an upconverter receiving the phase-shifted baseband signals, where the upconverter includes mixers. In this example, a given mixer may receive a particular phase-shifted baseband signal and a local oscillator (LO) signal to generate a radio frequency (RF) signal. The different mixers may generate an upconverted signal for each of the phase-shifted baseband signals, and summers may sum sets of those upconverted signals to generate the plus and minus components of a differential output RF signal. Further downstream components may include a driver amplifier that receives the differential output RF signal, converts it to a single-ended signal, and applies an amplified single-ended RF signal to a transducer such as an antenna.

Various embodiments include components upstream from the baseband phase generator. For instance, some systems include digital-to-analog converters (DACs) receiving a digital I signal and a digital Q signal and outputting analog differential I signals and analog differential Q signals. Some embodiments may further include low-pass filters receiving the analog differential I signals and analog differential Q signals, filtering the signals, and passing the filtered signals to the baseband phase generator. A frequency notch of the notch filters at the baseband phase generator may correspond to a frequency of alias of the DACs.

Moreover, various embodiments include methods of using the systems described above. In one example, a method may include receiving differential I and Q baseband signals at the inputs to a baseband phase generator. The baseband phase generator may apply the differential I and Q baseband signals to a network of notch filters to generate N phase-shifted baseband signals, where N is an integer greater than four. The mixer may then upconvert the phase-shifted baseband signals to produce a plurality of RF signals, and summers may sum various sets of the RF signals to generate a differential RF output signal.

Embodiments of the disclosure may be implemented in any of a variety of applications for wireless transmission of information. In one example, an embodiment may be implemented in a RF transmit path in a transceiver of a mobile wireless device. Example wireless devices in which various embodiments may be implemented include smart phones, tablet computers, laptop computers, and the like. The scope of embodiments is not limited to any particular wireless device.

FIG. 1 shows a wireless device 110 communicating with a wireless communication system 120, according to one embodiment. Specifically, various embodiments described herein may be implemented in the transceivers of any of the base stations, satellite 150, or wireless device 110. However, the examples described herein focus on implementation within a transceiver of a wireless device 110 for ease of illustration.

Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

Figure 2:
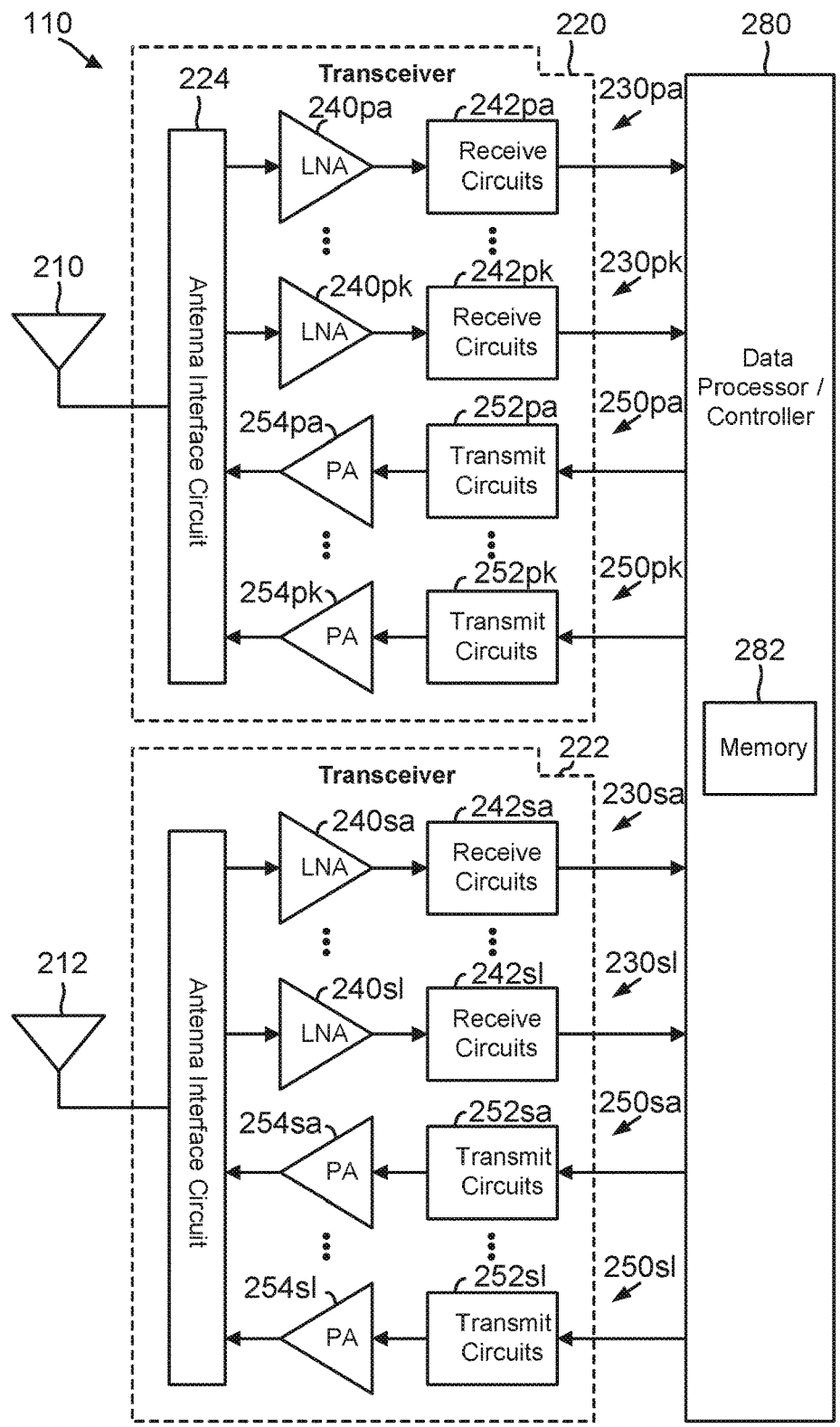
FIG. 2 illustrates an example block diagram of the wireless device of FIG. 1, in accordance with one embodiment.

FIG. 2 is an illustration of a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc. Transceiver 222 includes L receivers 230sa to 230sl and L transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which may be routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in a similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal may be routed through antenna interface circuit 224 and transmitted via antenna 210. Each remaining transmitter 250 in transceivers 220 and 222 may operate in a similar manner as transmitter 250pa.

In one example, transmit circuits 252pa, 252pk, 252sa, and 252sl may include baseband phase generators with notch filters as described herein. As noted above, use of notch filters to provide N phase-generated baseband signals may reduce a number of components and semiconductor area and manufacturing cost for the integrated circuits (ICs) including the transceivers 200 and 222.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog (ICs, RF ICs (RFICs)), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
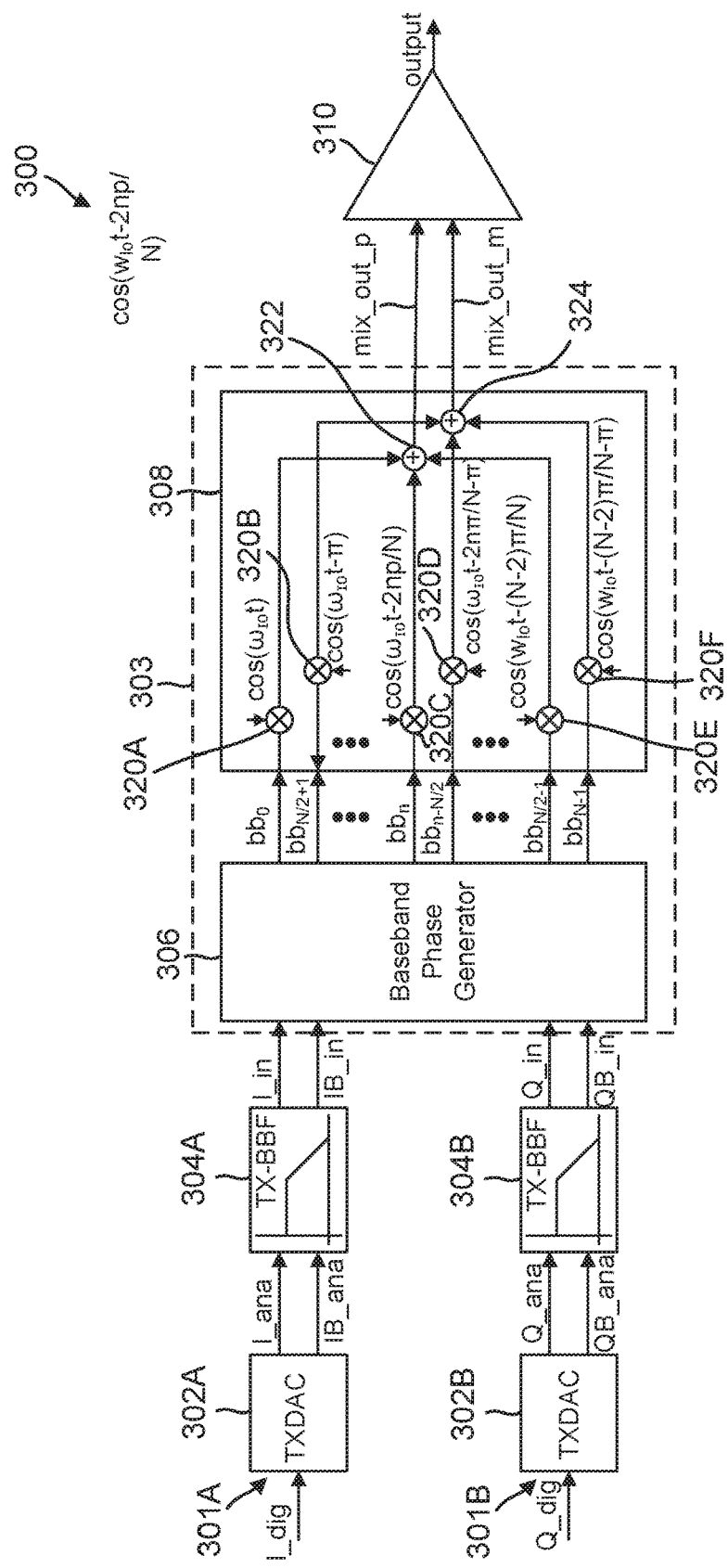
FIG. 3 is an illustration of an example transmit path of a wireless transmitter, such as one of the wireless transmitters of FIG. 2, according to one embodiment.

FIG. 3 depicts a device 300, in accordance with an exemplary embodiment of the present disclosure. Device 300 may include a transmit path in one or both of transmit circuits 252 of FIG. 2. Device 300 includes in-phase (I) and quadrature (Q) paths 301A and 301B, wherein each path includes an oversampling digital-to-analog converter (DAC) 302 and a baseband filter 304. Further, device 300 includes an upconverter 303 and an amplifier 310. Upconverter 303 includes a baseband phase generator 306 and an upconversion mixer 308. As described more fully below, device 300 may use multiple phases (i.e., N phases, wherein N>4) of transmit baseband signals and an equal number of LO phases to upconvert the transmit baseband signal to RF.

DAC 302A and 302B may each receive a digital signal and output one or more analog signals (e.g., quadrature phase signals). More specifically, in this example, DAC 302A may be configured to receive a digital in-phase signal (I_dig) and output an in-phase analog signal I_ana (0 degrees) and its complementary analog signal IB_ana (180 degrees) and DAC 302B may be configured to receive a quadrature digital signal Q_dig and output analog quadrature signal Q_ana (90 degrees) and its complementary analog signal QB_ana (270 degrees). Further, baseband filter 304A receives signal I_ana and signal IB_ana and outputs filtered differential signals I_in (0 degrees) and IB_in (180 degrees), and baseband filter 304B receives signal Q_ana and signal QB_ana and outputs filtered differential signals Q_in (90 degrees) and QB_in (270 degrees).

Baseband phase generator 306, which may be coupled between baseband filters 304A/304B and upconversion mixer 308, may include a network of notch filters, as described more fully below. Also, as described more fully below, various embodiments of baseband phase generator 306 may be implemented using passive components, such as resistors and capacitors. Baseband phase generator 306 may be configured to receive signals I_in, IB_in, Q_in, and QB_in, and output N phase signals (signals $bb_0$-$bb_{N-1}$), wherein N is greater than 4. Signals $bb_0$-$bb_{N-1}$ may be received by upconversion mixer 308.

Upconversion mixer 308 includes a plurality of mixers 320A-320F, which may be driven with multiphase LO signals (e.g., $\cos \omega_{lo}t - 2n\pi/N$). In this example, mixers 320 may upconvert a received baseband signal to an RF signal. It is noted that the multiphase LO signals may be overlapping, in comparison to 4-phase (i.e., 25% duty cycle) LO signals used in conventional passive upconverters. It is noted that upconversion mixer unit 308 may include N mixers, wherein N may be any value greater than four.

Upconversion mixer 308 further includes summers 322 and 324. Summer 322 may be configured to sum half of the RF signals (e.g., a first half, e.g., for N=8, the RF signals generated from baseband signals $bb_0$-$bb_3$) within upconversion mixer 308 and output signal mix_out_p to driver amplifier 310. Further, summer 324 may be configured to sum the other half of the RF signals (e.g., a second half, e.g., for N=8, $bb_4$-$bb_7$) within upconversion mixer 308 and output signal mix_out_m to driver amplifier 310.

For an N-phase transmitter, the differential output of upconversion mixer 308 may be converted to a single-ended output by subtraction, as follows:

$$\text{mix\_out\_}p(t) - \text{mix\_out\_}m(t) \qquad (1)$$

Further in this example, $bb_n(t)$ may be generated by baseband phase generator 306 according to the following equation $$bb_n(t) - bb_{n+\frac{N}{2}}(t) = \left[\cos\left(\frac{2*n*\pi}{N}\right)*I(t) + \sin\left(\frac{2*n*\pi}{N}\right)*Q(t)\right]*G \qquad (2)$$

wherein $I(t)=I\_in(t)-IB\_in(t)$ and $Q(t)=Q\_in(t)-QB\_in(t)$ and G is an arbitrary gain scaling factor.

In an example in which device 300 is included in a Long Term Evolution (LTE) radio frequency (RF) transmitter, DACs 302A and 302B may be implemented as oversampling DAC blocks. The output of the DACs 302A and 302B may contain thermal and quantization noise to be filtered using low-pass baseband filters 304A and 304B. Also, the output of the DACs 302A and 302B may contain alias of the baseband signal at the DAC sampling frequency. This DAC alias may in some instances fall into an RX band in some carrier aggregation modes, which may result in desensitization of the receiver path. Hence it may be beneficial to use a sharp attenuation to suppress DAC alias. In some conventional systems, a notch filter may be used to suppress DAC alias, but the notch filter may be implemented separate from the baseband signal generator. Various embodiments configure the passive RC components of the baseband phase generator 306 as a network of notch filters, thereby realizing two functions from the baseband phase generator 306—baseband phase generation and DAC alias filtering—while using fewer total components than would be used in a system having a baseband phase generator and notch filter built separately.

Figure 4:
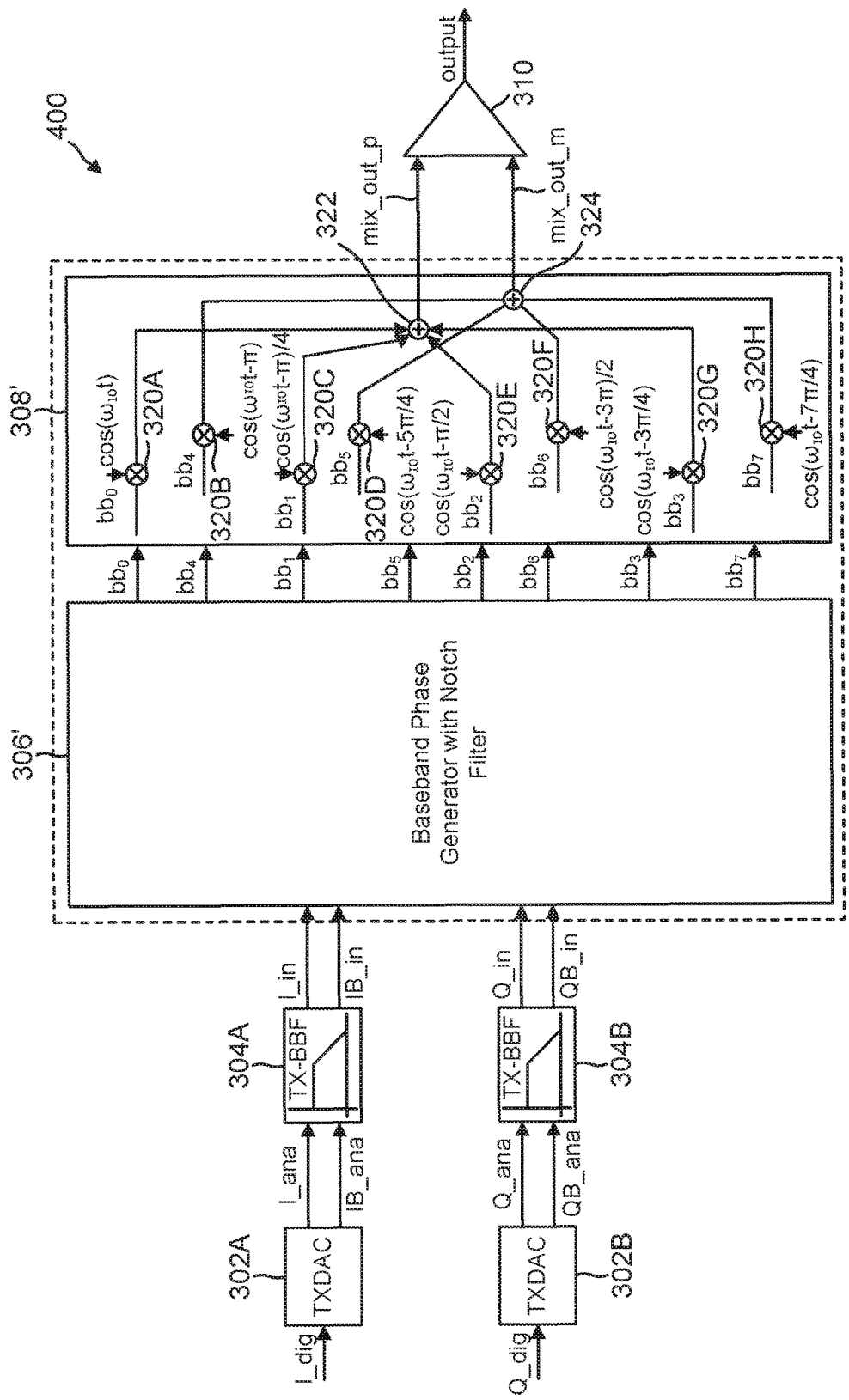
FIG. 4 illustrates an example transmit path of a wireless device, according to one embodiment.
Figure 5:
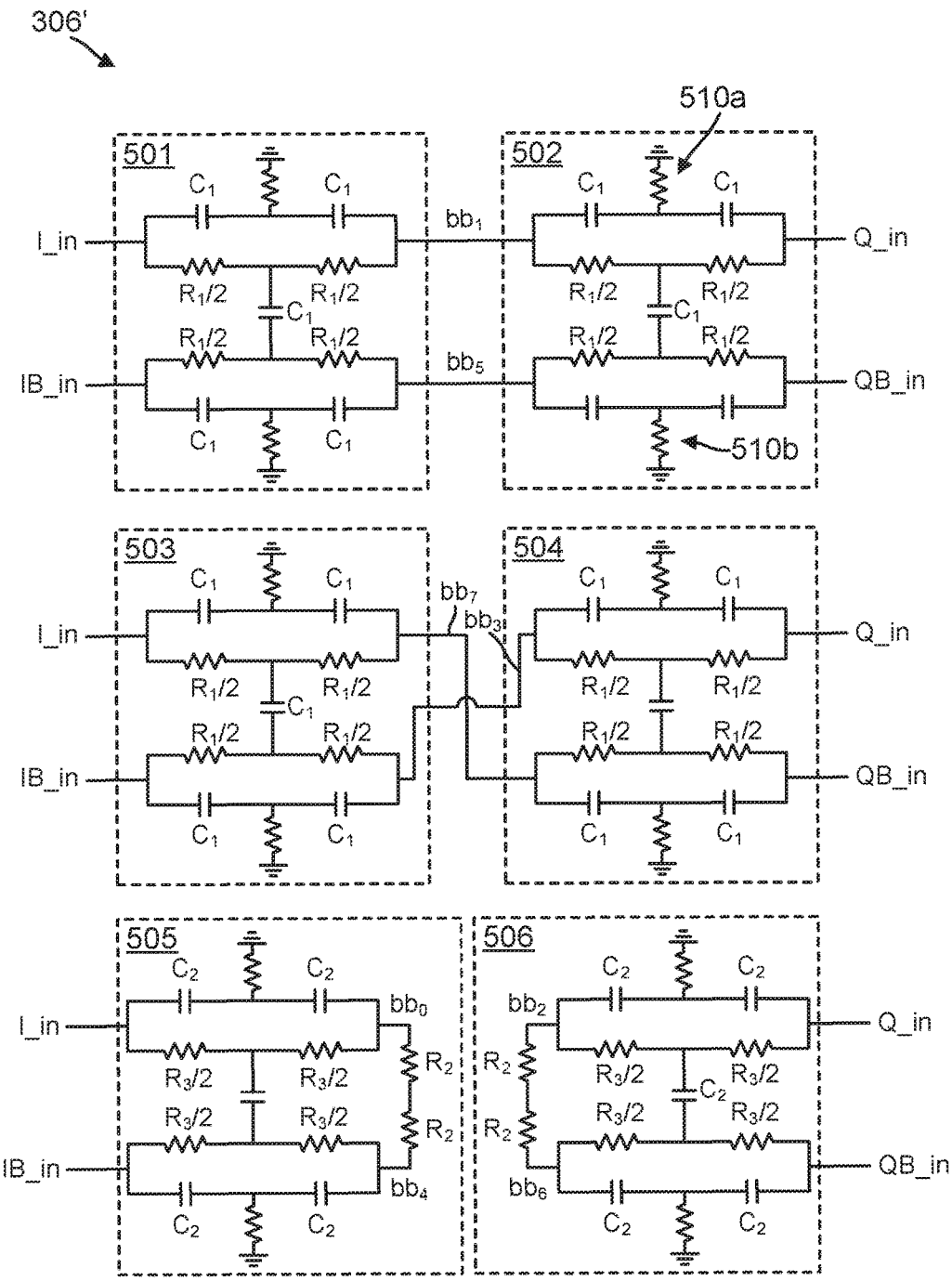
FIG. 5 illustrates an example baseband phase generator, according to one embodiment.

FIGS. 4 and 5 provides an example embodiment using eight baseband signals at the baseband phase generator. Specifically, FIG. 4 illustrates transmission path 400, adapted according to one embodiment. And FIG. 5 illustrates baseband phase generator 306' according to one embodiment. In the embodiment of FIGS. 4 and 5, the output of baseband phase generator 306' may be represented according to the following equations:

$$bb_0(t) - bb_4(t) = I(t)/\sqrt{2} \qquad (3)$$

$$bb_1(t) - bb_5(t) = \frac{I(t) + Q(t)}{2} \qquad (4)$$

$$bb_2(t) - bb_6(t) = Q(t)/\sqrt{2} \qquad (5)$$

$$bb_3(t) - bb_7(t) = \frac{-I(t) + Q(t)}{2} \qquad (6)$$

In the example of FIGS. 4 and 5, N=8 and G=1/sqrt(2). Baseband phase generator 306' may be configured to receive signals I_in, B_in, Q_in, and QB_in and output N phase signals (signals $bb_0$-$bb_{N-1}$) to an upconversion mixer 308'. In this example, upconversion mixer 308' includes mixers 320A-320H, each of which being configured to receive a baseband signal (i.e., $bb_0$-$bb_{N-1}$) and an associated LO signal (e.g., $\cos \omega_{LO} t - 2n\pi/N$). Upconversion mixer 308' further includes summers 322 and 324. Summer 322 may be configured to sum half of the RF signals (e.g., the RF signals generated from baseband signals $bb_0$-$bb_3$) within upconversion mixer 308' and output signal mix_out_p to driver amplifier 310. Further, summer 324 may be configured to sum the other half of the RF signals (e.g., the RF signals generated from baseband signals $bb_4$-$bb_7$) within upconversion mixer 308 and output signal mix_out_m to driver amplifier 310.

Looking at FIG. 5, input signals include the I differential signals (I_in and IB_in) and the Q differential signals (Q_in and QB_in), and since the Q differential signals are 90° offset from the I differential signals, that is four total input baseband phases. In the example of FIG. 5, the four input baseband phases are combined to give eight phases ($bb_0$-$bb_0$). Each input may be applied to three different ones of the twin-T notch filters. For instance, I_in and IB_in may be each applied to twin-T notch filters 501, 503, 505; Q_in and QB_in may be each applied to twin-T notch filters 502, 504, 506.

Continuing with this example, twin-T notch filters 501 and 502 produce the phase-shifted baseband signals $bb_1$ and $bb_5$, and twin T notch filters 503 and 504 produce the phase-shifted baseband signals $bb_7$ and $bb_3$. Output nodes are labeled $bb_n$, and while not shown in FIG. 5, it is understood that the phase-shifted baseband signals may be accessed at those nodes. Each one of the twin-T notch filters 501-504 employs resistors sized at a value of RI divided by 2 and capacitors with a value of $C_1$. The values of $C_1$ and $R_1$ may be chosen to produce a notch at the frequency of the DAC alias, according to Equation 1 below:

$$\text{freq\_notch} = 1/(2*pi*R*C_1), \text{ wherein } R=R_1/2 \qquad (7)$$

Moreover, the baseband phase generator to produce the baseband signals $bb_0$, $bb_2$, $bb_4$, and $bb_6$ uses resistors having a value of $R_3$ divided by two and resistors having a value of $R_2$ as well as capacitors with a value of $C_2$. The values of $C_2$, $R_2$, and $R_3$ may be determined using Equations 8-10 below:

$$R_2 = R_1/[\text{sqrt}(2)*\{\text{sqrt}(2)-1\}] \qquad (8)$$

$$R_3 = R_1/\text{sqrt}(2) \qquad (9)$$

$$\text{freq\_notch} = 1/(pi*R_3*C_2) \qquad (10)$$

Each one of the twin-T notch filters 501-506 includes resistors coupling that twin-T notch filter to ground. An example is shown at twin-T notch filter 502, having resistors 510 coupling it to ground. Resistors 510a may be sized at any appropriate value, and in this example may have a resistance value of 100 or 1000 times that of $R_1$ to minimize current to ground.

One feature of note in this example is that the physical structure of the baseband phase generator pairs the twin-T notch filters 501-506 according to a pattern in which the paired phases are 180° apart. In this instance, the phases may be spread out from each other by 45°, so that for example $bb_1$ and $bb_5$ are paired and are separated by 180°. Or put another way, their indices 1 and 5 have a difference of four because four multiplied by 45° is 180°. The same is true for $bb_0$ and $bb_4$, $bb_2$ and $bb_6$, and $bb_3$ and $bb_7$. The example of FIG. 5 is shown with eight phase-shifted baseband signals ($bb_0$-$bb_7$), and it is understood that other embodiments may include a different number of phase-shifted baseband signals. For example, other embodiments may output six phase-shifted baseband signals, where the paired phases have indices that have a difference of three.

Further in this example, the capacitors may be formed using any appropriate method, now known or later developed. For example, the capacitors may be formed using metal layers within a semiconductor chip in some embodiments. In other embodiments, the capacitors may be formed using transistors shorting source, drain, and body and having appropriate bias applied to provide desired capacitance across a range of voltages.

Figure 6:
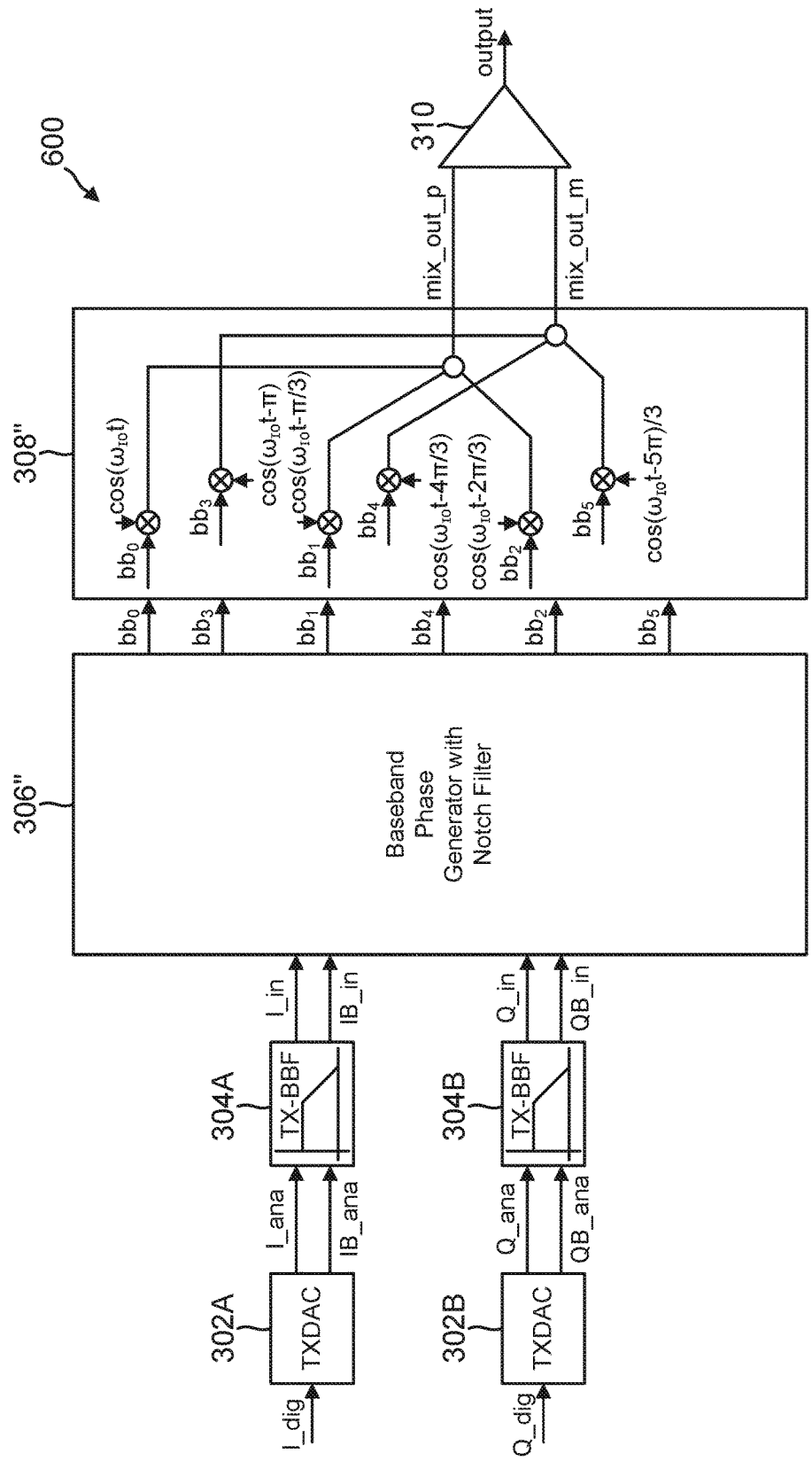
FIG. 6 illustrates an example transmit path of a wireless device, according to one embodiment.
Figure 7:
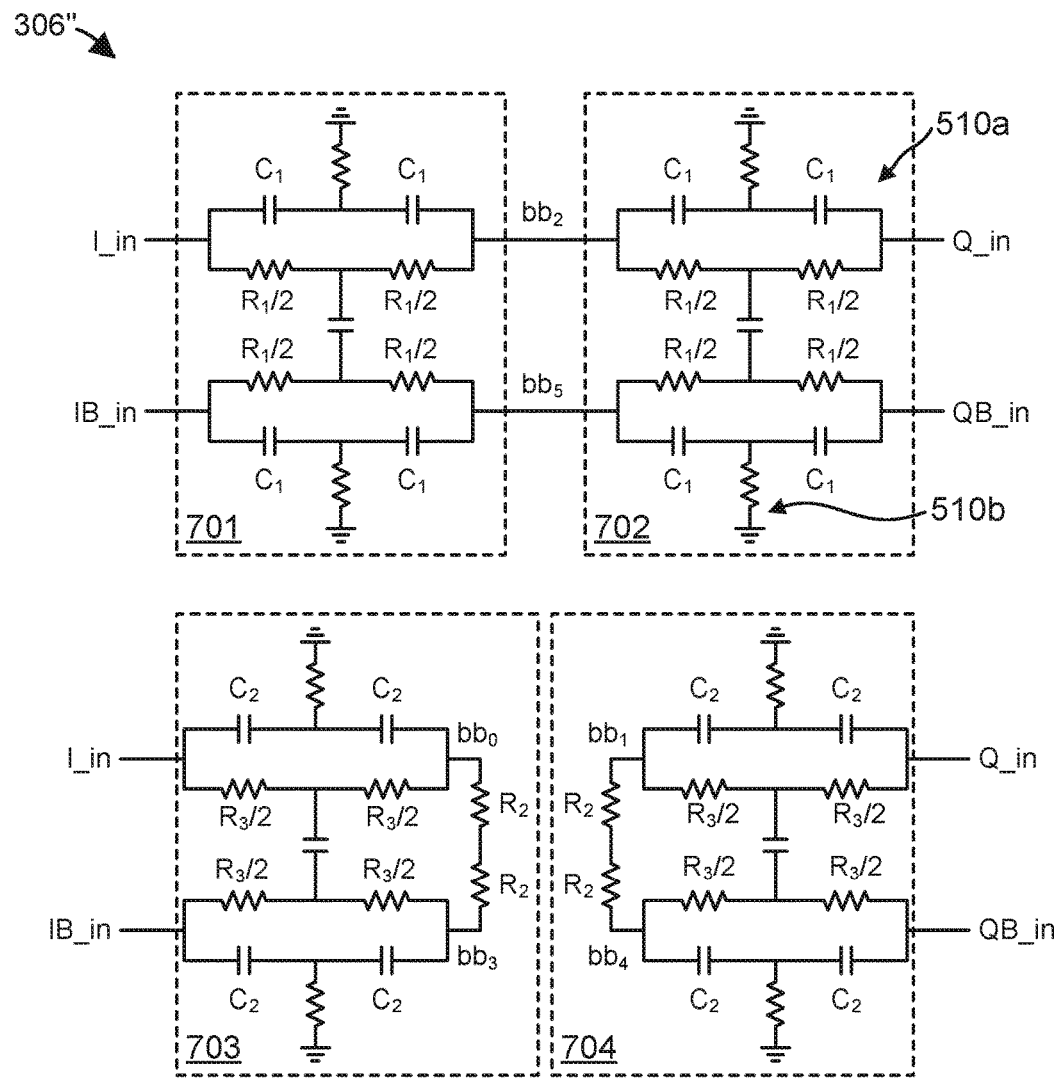
FIG. 7 illustrates an example baseband phase generator, according to one embodiment

The example embodiments of FIGS. 6 and 7 illustrate a transmit path providing six phase-shifted baseband signals. Specifically, FIG. 6 illustrates a transmit path 600, according to one embodiment. FIG. 7 illustrates baseband phase generator 306", configured to generate six phase-shifted baseband signals, according to one embodiment. Thus, in this example N=6. As illustrated in FIG. 6, this implementation may use analog baseband processing within baseband phase generator 306" with a gain scaling factor of sqrt(3)/2.

The baseband phase generator 306" in the example of FIG. 7 includes four twin-T notch filters 701-704. In this instance, the physical structure of the baseband phase generator pairs the twin-T notch filters 701-704 according to a pattern in which the paired phases are 180° apart. For example, the phases may be spread out from each other by 60°, so that for example $bb_1$ and $bb_5$ are paired and are separated by 180°. Or put another way, their indices 2 and 5 have a difference of three because three multiplied by 60° is 180°. The same is true for $bb_0$ and $bb_3$ and $bb_1$ and $bb_4$.

Some conventional baseband phase generators may include RC circuits to generate the phase-shifted baseband signals, but those RC circuits would not have included twin-T notch filters. Rather, notch filtering would have instead been performed using notch filters placed somewhere else in the transmit path. By contrast, the embodiments of FIGS. 5 and 7 may use twin-T notch filters to generate the phase-shifted baseband signals. Thus, some embodiments may advantageously omit standalone notch filters for DAC alias, thereby reducing a total number of components and saving manufacturing cost.

Figure 8:
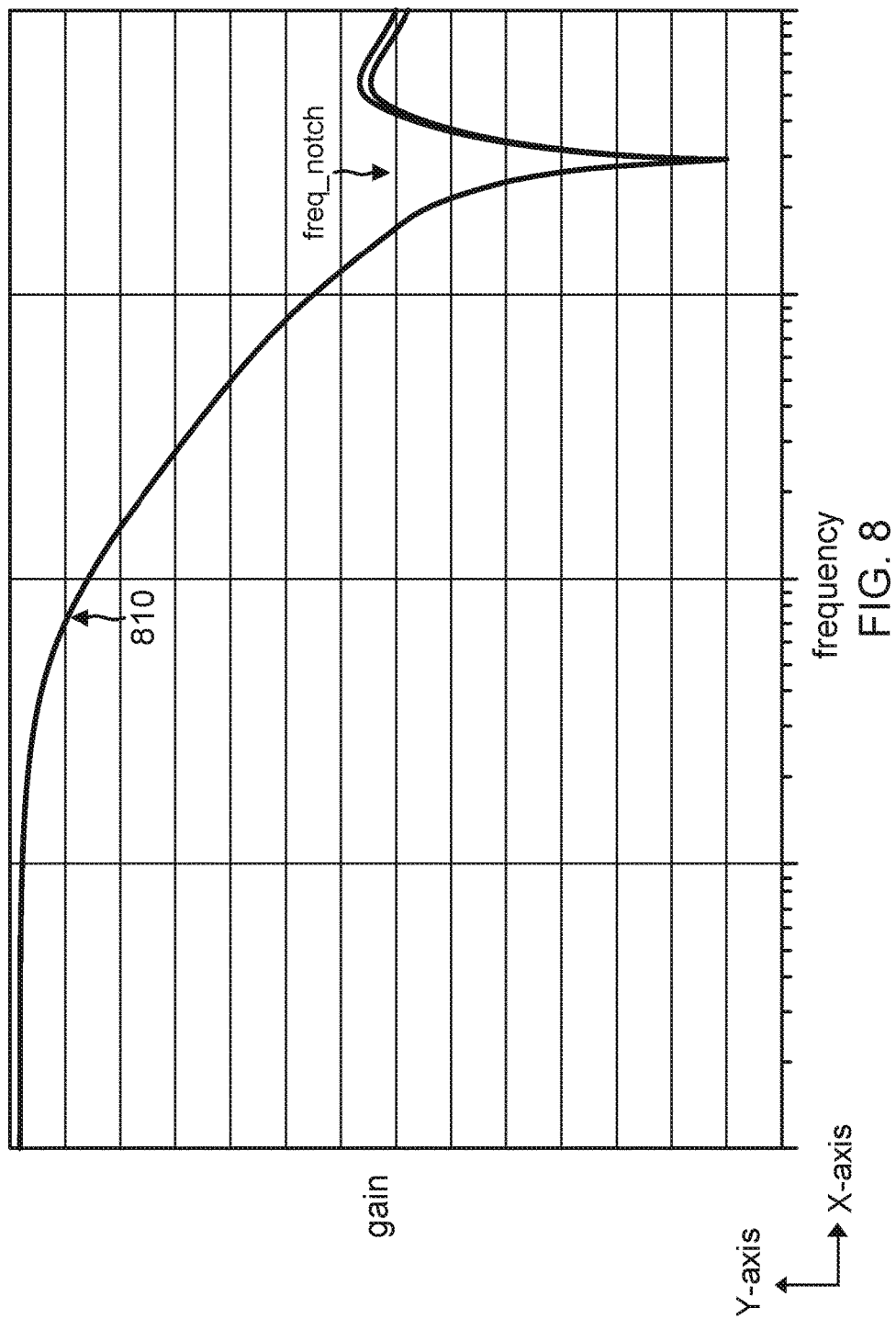
FIG. 8 illustrates an example frequency response curve of a twin-T notch filter, according to one embodiment.

FIG. 8 is an illustration of an example frequency response of a twin-T notch filter, according to one embodiment. Curve 810 is plotted with gain (decibels) on the Y-axis and frequency (log 10) on the X-axis. The frequency notch from equations 7 and 10 is illustrated as a relatively small frequency range wherein gain is relatively low, with substantial gain on either side of that frequency range. In one example use case, the frequency notch may be placed at 300 MHz for an LTE transmission path, although the scope of embodiments may be adapted for any appropriate envelope signal and any appropriate DAC sampling frequency so that the notch corresponds to a frequency of alias of the DACs. The twin-T notch filters of FIGS. 5 and 7 may be configured to produce gain curves similar to that shown in FIG. 8, using resistor and capacitor values illustrated above with respect to equations 7-10.

Of further note in the examples of FIGS. 3-7, the upconversion mixers 308, 308', and 308" may be referred to as harmonic rejection upconverters. Specifically, in these examples, the summers (e.g., 322, 324) may cancel the harmonics generated by the mixers themselves, thereby improving linearity of the transmitter. Thus, various embodiments couple a harmonic rejection upconverter with a baseband phase generator having integrated notch filters.

Figure 9:
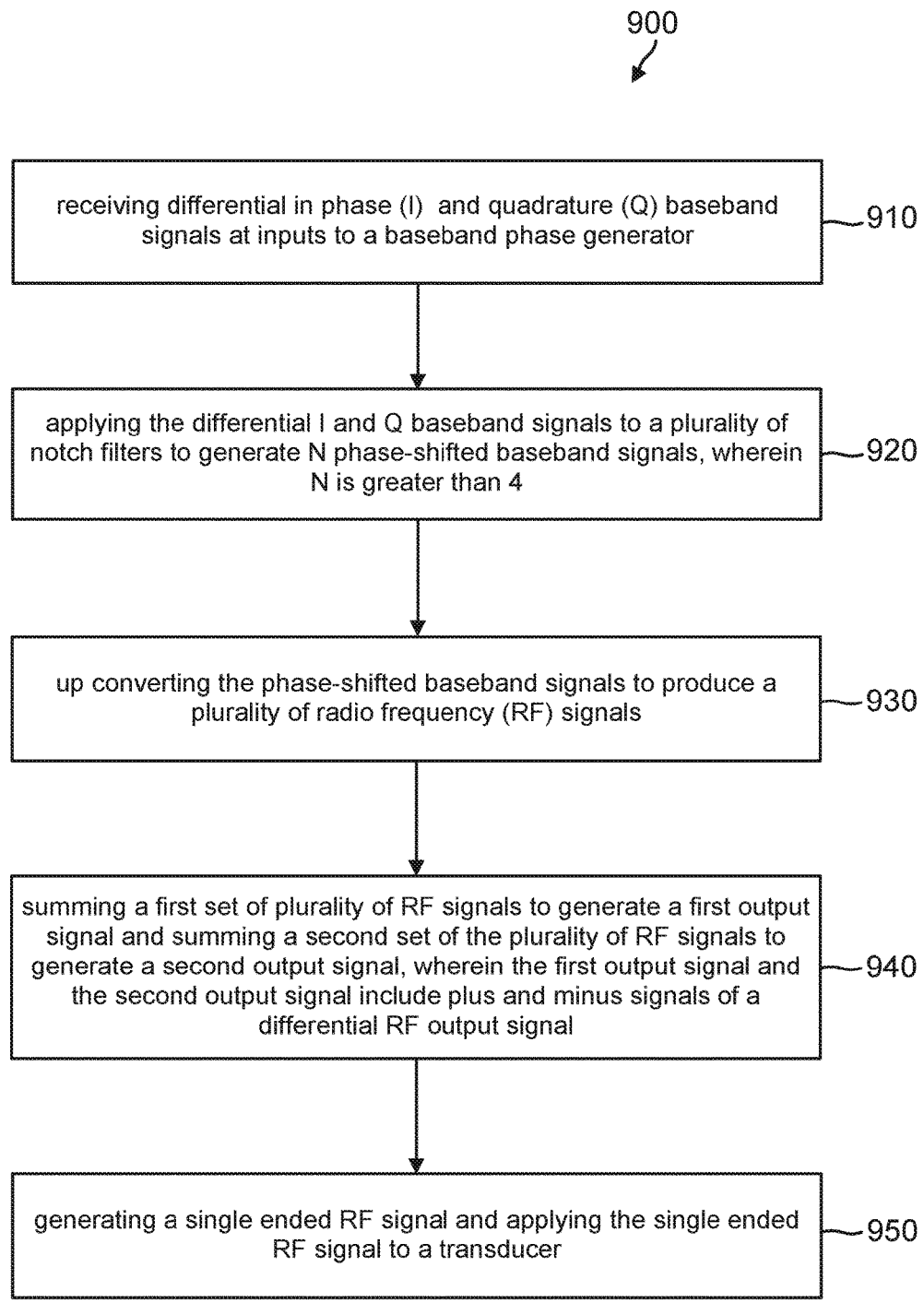
FIG. 9 is an illustration of an example method to be performed with the systems of FIGS. 1-5 and 10, according to an embodiment of the disclosure.

FIG. 9 is an illustration of an example method 900 in which the systems of FIGS. 1-7 may be used, according to various embodiments. For instance, the actions 910-950 of method 900 may be performed by wireless devices having transmit paths with baseband phase generators, such as illustrated at FIGS. 1-7.

At action 910, a baseband phase generator receives differential I and Q baseband signals at its inputs. An example is shown at FIGS. 3, 4, and 6, wherein I_in and IB_in may be differential I signals, and wherein Q_in and QB_in may be differential Q signals.

At action 920, the differential I and Q baseband signals are applied to a plurality of notch filters. An example is shown at FIGS. 5 and 7, wherein the I and Q signals may be applied to the notch filters 501-506 and 701-704. In these examples, the notch filters include twin-T notch filters, which may be configured using passive components (resistors and capacitors). Continuing with the example, the baseband phase generator generates N phase-shifted baseband signals, wherein N is greater than 4. For instance, in the examples above, one embodiment generates eight phase-shifted baseband signals and another embodiment generates six phase-shifted baseband signals. However, the scope of embodiments is not limited to six-phase and eight-phase embodiments, as any appropriate number of phase-shifted baseband signals may be produced by changing a number of twin-T notch filters and changing values of capacitors and resistors therein to meet a specification.

At action 930, the system upconverts the phase-shifted baseband signals to produce a plurality of RF signals. Examples are shown above at FIGS. 3, 4, and 6, wherein mixers receive respective phase-shifted baseband signals and LO signals to generate RF signals. In the examples above, N phase-shifted baseband signals may be upconverted to N RF signals.

At action 940, the upconverter block sums a first set of the plurality of RF signals to generate a first output signal and also sums a second set of the plurality of RF signals to generate a second output signal. One example is shown at FIG. 4, wherein summer 322 adds the RF signals produced from $bb_0$-$bb_3$, and wherein summer 324 adds the RF signals produced from $bb_4$-$bb_7$. Another example is shown at FIG. 6, wherein one summer adds the RF signals produced from $bb_0$-$bb_1$, and the other summer adds the RF signals produced from $bb_3$-$bb_5$. In both examples of FIGS. 4 and 6, one summer generates a first output signal (mix_out_p) and the other summer generates the second output signal (mix_out_m). In other words, the example differential output RF signal includes mix_out_p and mix_out_m. In some example embodiments, the summing may cancel out harmonics from the mixing, so that mix_out_m and mix_out_p may have reduced harmonics and, thus, the greater linearity.

At action 950, a downstream component, such as an operational amplifier, generates a single-ended RF signal and applies the single-ended RF signal to a transducer. In the example of FIGS. 3, 4, and 6, the driver amplifier 310 creates a single-ended signal from the differential output RF signal by, e.g., subtracting mix_out_m from mix_out_p. The downstream component may then apply the single-ended RF signal to a transducer, such as an antenna.

The scope of embodiments is not limited to the particular actions shown in method 900. Rather, other embodiments may add, omit, rearrange, or modify one or more actions. For instance, actions 910 through 950 may be performed continuously during operation of a transmit path, at least during transmitting operations.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A radio frequency (RF) transmit path comprising:
   means for generating differential in-phase (I) and quadrature (Q) baseband signals;
   means for generating N phase-shifted baseband signals from the I and Q baseband signals through use of a plurality of notch filters, wherein N is greater than 4; and
   means for upconverting the phase shifted baseband signals to produce a plurality of RF signals.

2. The RF transmit path of claim 1, further comprising:
   means for summing a first set of the plurality of RF signals to generate a first output signal; and
   means for summing a second set of the plurality of RF signals to generate a second output signal.

3. The RF transmit path of claim 2, further comprising:
   means for generating a single-ended RF signal from the first and second output signal.

4. The RF transmit path of claim 1, wherein the means for generating differential I and Q baseband signals comprises:
   a plurality of digital to analog converters (DACs) configured to receive I and Q digital signals and to output differential analog I and Q signals; and
   a plurality of low-pass filters configured to receive the differential analog I and Q signals and to output the differential I and Q baseband signals
   wherein a frequency notch of the notch filters corresponds to a frequency of alias of the DACs.

5. The RF transmit path of claim 1, wherein the plurality of notch filters comprises a plurality of twin-T notch filters.

6. The RF transmit path of claim 1, wherein the means for upconverting comprises N mixers, where each of the mixers is configured to receive a respective one of the phase shifted baseband signals and a local oscillator (LO) signal.

* * * * *